(12) United States Patent
Cheng

(10) Patent No.: US 10,970,046 B2
(45) Date of Patent: Apr. 6, 2021

(54) RANDOM NUMBER GENERATOR COMPATIBLE WITH COMPLEMENTARY METAL-OXIDE SEMICONDUCTOR TECHNOLOGY

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 223 days.

(21) Appl. No.: 16/283,006

(22) Filed: Feb. 22, 2019

(65) Prior Publication Data
US 2020/0272420 A1    Aug. 27, 2020

(51) Int. Cl.
G06F 7/58    (2006.01)
G11C 7/18    (2006.01)
G06F 9/30    (2018.01)
G11C 7/10    (2006.01)

(52) U.S. Cl.
CPC .......... *G06F 7/582* (2013.01); *G06F 9/30021* (2013.01); *G11C 7/1006* (2013.01); *G11C 7/18* (2013.01)

(58) Field of Classification Search
CPC .... G06F 7/58; G06F 9/30; G11C 7/18; G11C 7/10
USPC ................................................ 708/250–256
See application file for complete search history.

(56) References Cited

U.S. PATENT DOCUMENTS

| | | | |
|---|---|---|---|
| 7,221,580 B1 | 5/2007 | Penchuk | |
| 7,502,815 B1 | 3/2009 | Drimer | |
| 7,979,482 B2 | 7/2011 | Gammel et al. | |
| 8,522,065 B2 | 8/2013 | Regev et al. | |
| 9,189,202 B2 | 11/2015 | Burleson et al. | |
| 9,640,247 B2 | 5/2017 | Chen et al. | |
| 9,747,078 B2 | 8/2017 | Moschopoulos et al. | |
| 10,078,496 B2 | 9/2018 | Gupta et al. | |
| 10,691,856 B1* | 6/2020 | Lysaght | G06F 30/392 |
| 2008/0192863 A1* | 8/2008 | Mehrnia | H04B 1/7156 375/324 |
| 2012/0262980 A1 | 10/2012 | Rao | |

(Continued)

OTHER PUBLICATIONS

R. Giterman et al., 4T Gain-Cell with Internal-Feedback for Ultra-Low Retention Power at Scaled CMOS Nodes, 2014 IEEE International Symposium on Circuits and Systems (ISCAS), Jul. 28, 2014, pp. 1-4, IEEE.

(Continued)

*Primary Examiner* — Tan V Mai
(74) *Attorney, Agent, or Firm* — Tutunjian & Bitetto, P.C.; Randall Bluestone

(57) ABSTRACT

A semiconductor device including a random number generator includes a memory device component including an array of a plurality of memory cells, and a comparator component including a plurality of comparators connected to respective pairs of read bitlines (RBLs). Each of the plurality of comparators is configured to read the array by comparing signals of its corresponding pair of RBLs, and generate an output based on a comparison. The outputs are assembled to generate a bit stream corresponding to a random number.

20 Claims, 5 Drawing Sheets

(56) References Cited

U.S. PATENT DOCUMENTS

| | | |
|---|---|---|
| 2016/0028544 A1 | 1/2016 | Hyde et al. |
| 2018/0004944 A1 | 1/2018 | Nagata et al. |
| 2018/0129476 A1 | 5/2018 | Wesson et al. |
| 2018/0158534 A1* | 6/2018 | Otterstedt ............ G11C 7/1006 |
| 2018/0165065 A1 | 6/2018 | Kuo et al. |
| 2018/0195998 A1 | 7/2018 | Kalnitsky et al. |
| 2018/0286486 A1 | 10/2018 | Tiwari et al. |

OTHER PUBLICATIONS

E. Amat et al., Modern Gain-Cell Memories in Advanced Technologies, 2018 IEEE 24th International Symposium on On-Line Testing and Robust System Design (IOLTS), Jul. 2018, pp. 65-68, IEEE.

M. Khalid, Multilevel Gain Cell Arrays for Fault-Tolerant VLSI Systems, Linkoping University Master's Thesis, 2011, pp. 1-90, Linköping University.

V. Suresh, On-Chip True Random Number Generation in Nanometer CMOS, University of Massachusetts Amherst Master's Thesis, 2012, pp. 1-93, University of Massachusetts Amherst.

* cited by examiner

RANDOM NUMBER GENERATOR COMPATIBLE WITH COMPLEMENTARY METAL-OXIDE SEMICONDUCTOR TECHNOLOGY

BACKGROUND

The present invention generally relates to semiconductor devices, and more particularly to random number generators compatible with complementary metal-oxide semiconductor technology and methods of forming the same.

Random numbers (e.g., high entropy random numbers) can be used in a variety of applications including, but not limited to, security key generation, statistical simulation (e.g., Monte-Carlo simulations), and gambling systems. Random number generators are devices that can be used to generate a sequence of random numbers or symbols. Examples of random number generators include, e.g., hardware random-number generators (HRNGs), which are hardware-based random number generators that can generate truly random numbers based on random phenomena, and pseudo-random number generators (PRNGs), which are software-based random number generators that can generate "pseudo-random" numbers based on an algorithm (numbers generated by PRNGs are not truly random due to the deterministic nature of software programming).

SUMMARY

In accordance with an embodiment of the present invention, a method for implementing a semiconductor device including a random number generator is provided. The method includes reading an array of a plurality of memory cells of a memory device component of a random number generator. Reading the array includes comparing signals between pairs of read bitlines (RBLs) connected to corresponding comparators of a comparator component of the random number generator. The method further includes obtaining outputs from each of the comparators based on the comparison, and generating a bit stream corresponding to a random number. Generating the bit stream includes assembling the outputs from each of the comparators.

In accordance with another embodiment of the present invention, a method for fabricating a semiconductor device including a random number generator is provided. The method includes initializing an array of a plurality of memory cells of a memory device component. Each of the plurality of memory cells is a two-transistor (2T) gain memory cell including a write wordline (WWL) and a write bitline (WBL), and the second transistor includes a read wordline (RWL) and the a read bitline (RBL). The method further includes reading the array at a time period determined based on a nominal retention time of the plurality of gain memory cells. Reading the array includes comparing signals between pairs of read bitlines (RBLs) connected to corresponding comparators of a comparator component. The method further includes obtaining outputs from each of the comparators based on the comparison. For each RBL pair, the comparator outputs a logic "1" in response to a current of a left RBL of the RBL pair exceeding a current of a right RBL of the RBL pair, and the comparator outputs a logic "0" in response to the current of the left RBL being less than the current of the right RBL. The method further includes generating a bit stream corresponding to a random number. Generating the bit stream includes assembling the outputs from each of the comparators.

In accordance with yet another embodiment of the present invention, a semiconductor device including a random number generator is provided. The device includes a memory device component including an array of a plurality of memory cells, and a comparator component including a plurality of comparators connected to respective pairs of read bitlines (RBLs). Each of the plurality of comparators is configured to read the array by comparing signals of its corresponding pair of RBLs, and generate an output based on a comparison. The outputs are assembled to generate a bit stream corresponding to a random number.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
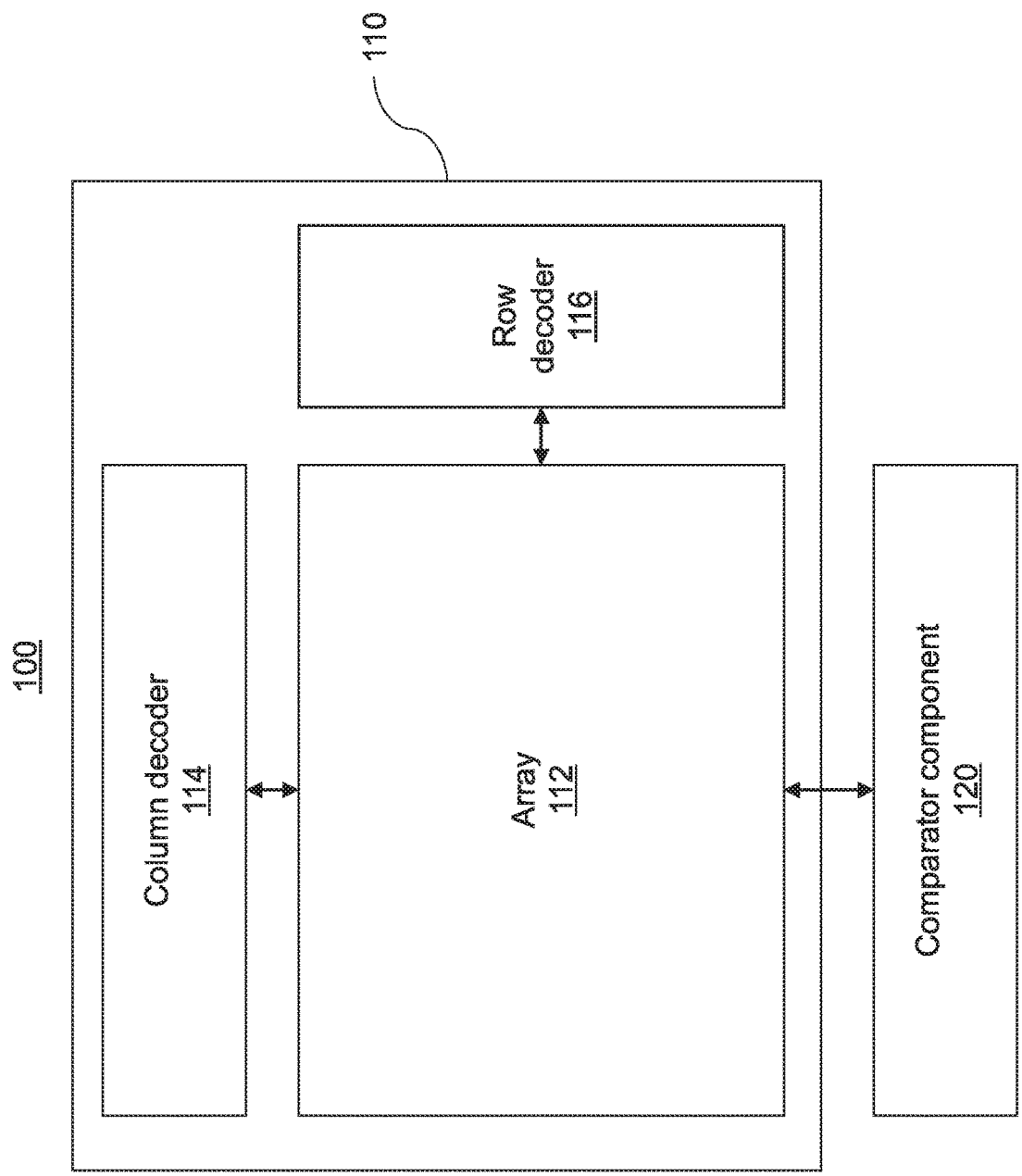
FIG. 1 is a block diagram of a system implementing a random number generator, in accordance with an embodiment of the present invention.

Analog circuitry for converting analog signals into digital signals can be used by HRNGs to generate random numbers, posing integration challenges with respect to low power digital chips. As a result, HRNGs can be off-chip devices, meaning that they can be fabricated separately with legacy technology nodes and mounted next to digital chips (e.g., microprocessors) at packing levels. However, communication between off-chip HRNGs and the digital chips can be vulnerable to attackers via, e.g., bus snooping (e.g., side-channel attacks).

To address at least the above-noted drawbacks, the embodiments described herein provide for on-chip random number generators (e.g., HRNGs) that are compatible with complementary metal-oxide semiconductor (CMOS) technology. The random number generators described herein can be used for integration with respect to digital chips (e.g., microprocessors). Since the random number generators described herein are on-chip, and can generate random numbers by exploiting entropy derived from natural sources, the on-chip random number generators described herein can be less vulnerable to attack as compared to other types of random number generators (e.g., off-chip HRNGs and PRNGs).

More specifically, the random number generators described herein can include an array of memory cells. For example, the random number generators can include an array of gain memory cells. Although short and varying retention times associated with an array of gain memory cells are drawbacks for using gain memory cells in memory applications, the embodiments described herein can leverage the short and varying retention times associated with an array of gain memory cells to implement a random number generator.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a block diagram is provided illustrating a system 100 implementing a random number generator.

As shown, the system 100 includes a memory device component 110. The memory device 110 can include a memory cell array ("array") 112. The array 112 can include a plurality of memory cells. In one embodiment, the plurality of memory cells include a plurality of gain memory cells. The memory device 110 can further include a column decoder 114 coupled to bitlines of the plurality of memory cells of the array 112 (e.g., read bitlines and write bitlines), and a row decoder 116 coupled to wordlines of the plurality of memory cells of the array 112 (e.g., read wordlines and write wordlines).

As further shown, the system 100 further includes a comparator component 120. The comparator component 120 can include a plurality of comparators configured to generate respective outputs. In one embodiment, the comparator component 120 can include a plurality of sense amplifiers.

More specifically, and as will be described in further detail below with reference to FIGS. 2-5, the plurality of comparators are configured to read the memory cells of the array 110 by comparing signals (e.g., current/voltage) between corresponding pairs of read bitlines to output respective logic numbers (e.g., logic "0" or logic "1"). Due to inherent random variation associated with transistors of the memory cells of the memory device 110, the outputs can be randomly generated outputs, which can then be assembled to generate a random n-digit or n-bit number. For example, if there are 512 comparators for 512 corresponding pairs of read bitlines, a 512-digit or 512-bit random number can be generated. Higher or lower bit random numbers can be obtained by concatenation and/or splitting of the assembled outputs. Accordingly, the comparator component 120 can exploit the functionality of the memory device component 110 of the system 100 to implement a random number generator (e.g., HRNG).

Further details regarding the system of FIG. 1 will now be described below with reference to FIGS. 2-5.

Figure 2:
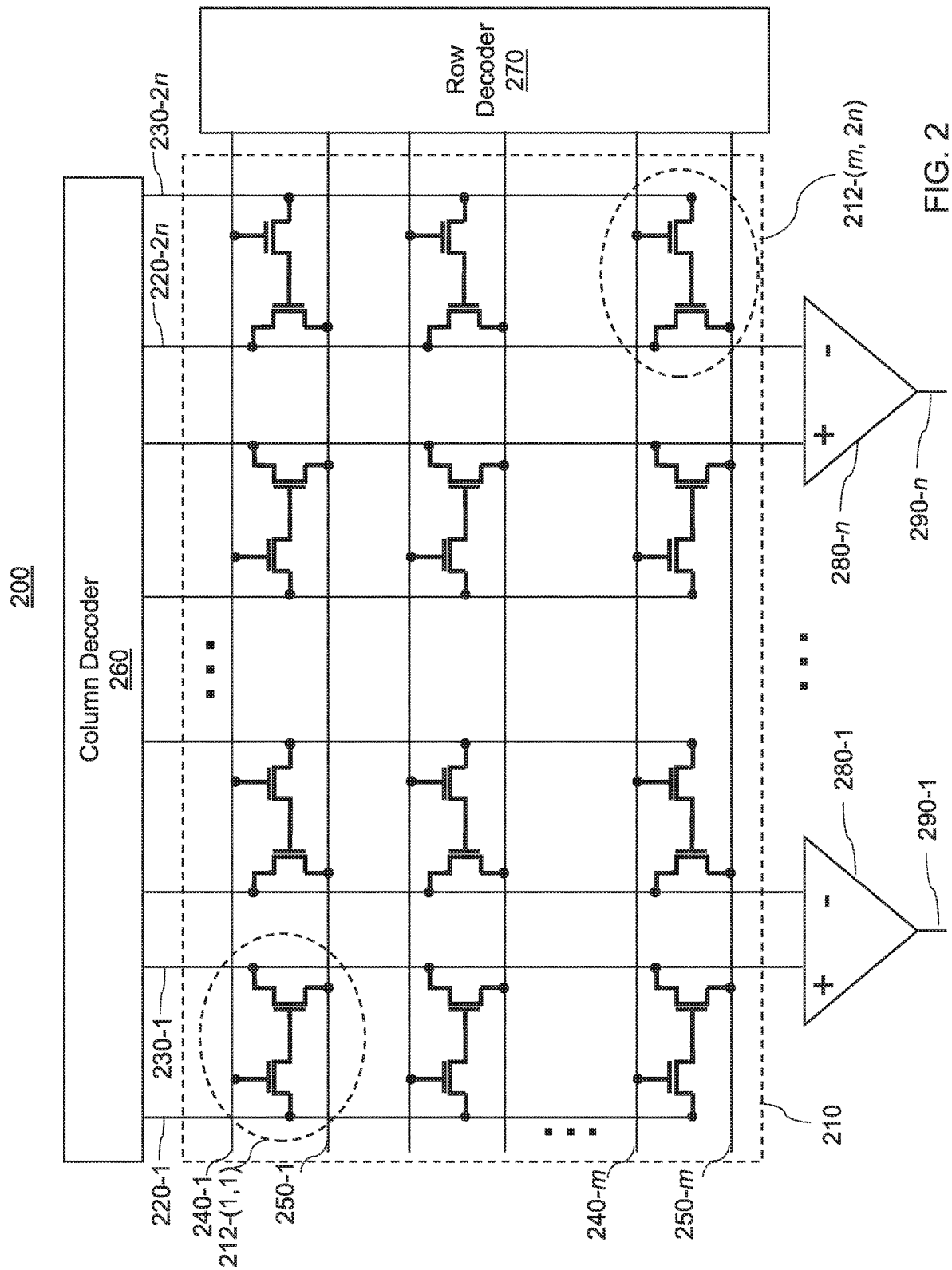
FIG. 2 is an overview of a system implementing a random number generator, in accordance with an embodiment of the present invention.

With reference to FIG. 2, a schematic of a system 200 implementing a random number generator is provided.

The system 200 includes an array 210. The array 210 can include m rows and 2n columns of memory cells, including memory cells 212-(1,1) through 212-(m, 2n). In one embodiment, the memory cells 212-(1,1) through 212-(m, 2n) can include gain memory cells. As an illustrative example, the array 210 can include 16 rows and 1024 columns, corresponding to 16,384 bits (e.g., about 16 Kb) associated with 16,384 memory cells. However, such an embodiment should not be considered limiting, and the array 210 can include any suitable number of rows and columns.

Each of the memory cells 212-(1,1) through 212-(m, 2n) can include a plurality of transistors. For example, the transistors can include, e.g., field-effect transistors (FETs). In one embodiment, each of the memory cells 212-(1,1) through 212-(m, 2n) can include two transistors. In another embodiment, each of the memory cells can include three-transistors. However, each of the memory cells 212-(1,1) through 212-(m, 2n) can include any suitable number of transistors in accordance with the embodiments described herein. Accordingly, the array 210 can include 2T, 3T, etc. memory cells.

Further details regarding the structure of exemplary 2T and 3T memory cells will be described below with reference to FIGS. 3 and 4.

As further shown, the array 210 can include a plurality of lines. More specifically, the array 210 can include a plurality of write bitlines (WBLs) 220-1 through 220-2n, a plurality of read bitlines (RBLs) 230-1 through 230-2n, a plurality of write wordlines (WWLs) 240-1 through 240-m, and a plurality of read word lines (RWLs) 250-1 through 250-m. The WBLs 220-1 through 220-2n and the RBLs 230-1 through 230-2n can be coupled to a column decoder 260, and the WWLs 240-1 through 240-m and the RWLs 250-1 through 250-m can be coupled to a row decoder 270.

The RBLs of adjacent ones of the memory cells can form a pair of RBLs, with each pair of RBLs including a first RBL and a second RBL. For example, the first RBL can be a "left" RBL and the second RBL can be a "right" RBL. Since there are 2n columns of memory cells in the array 210, there are a total of n pairs of RBLs. Accordingly, in the embodiment in which there are 1024 columns, there can be 1024/2=512 pairs of RBLs.

The system 200 can include a plurality of comparators 280-1 through 280-n each coupled to a respective pair of the RBLs. In one embodiment, the comparators 280-1 through 280-n can include, e.g., sense amplifiers.

The comparators 280-1 through 280-n can generate a random number as a bit stream by reading the memory cells of the array 210. More specifically, each of the comparators 280-1 through 280-n can read the memory cells of the array 210 by comparing the signals (e.g., current/voltage) between the RBLs of the corresponding pair of RBLs (e.g., left RBL vs. right RBL) to output a logic number. For example, the comparator 280-1 can generate an output 290-1, and the comparator 280-n can generate an output 290-n.

In one embodiment, if the current of the left RBL of a given pair of RBLs is greater than the current of the right RBL of the given pair of RBLs, then the corresponding comparator can output a logic number "1" and, if the current of the left RBL of the given pair of RBLs is less than the current of the right RBL of the given pair of RBLs, then the corresponding comparator can output a logic number "0". However, such an embodiment should not be considered limiting.

Due to inherent random variation associated with transistors, each of the outputs generated by comparators 280-1 through 280-n can be a randomly generated output. Thus, the outputs of the comparators 280-1 through 280-n can be assembled to generate a random n-digit or n-bit number. For example, in the embodiment in which there are n=512 pairs of RBLs and n=512 corresponding comparators, a random 512-bit number can be generated by assembling the outputs of the comparators 280-1 through 280-n.

Prior to reading the memory cells of the array 210, the array 210 can be initialized. For example, the array 210 can be initialized by writing logic numbers to corresponding memory cells as a seed for the initialization. In one embodiment, obtaining the logic numbers includes randomly generating each of the logic numbers using a pseudo-random number generator. In another embodiment, each of the logic numbers is obtained as a same logic number. For example, each of the logic numbers can be obtained as, e.g., logic "1".

Figure 3:
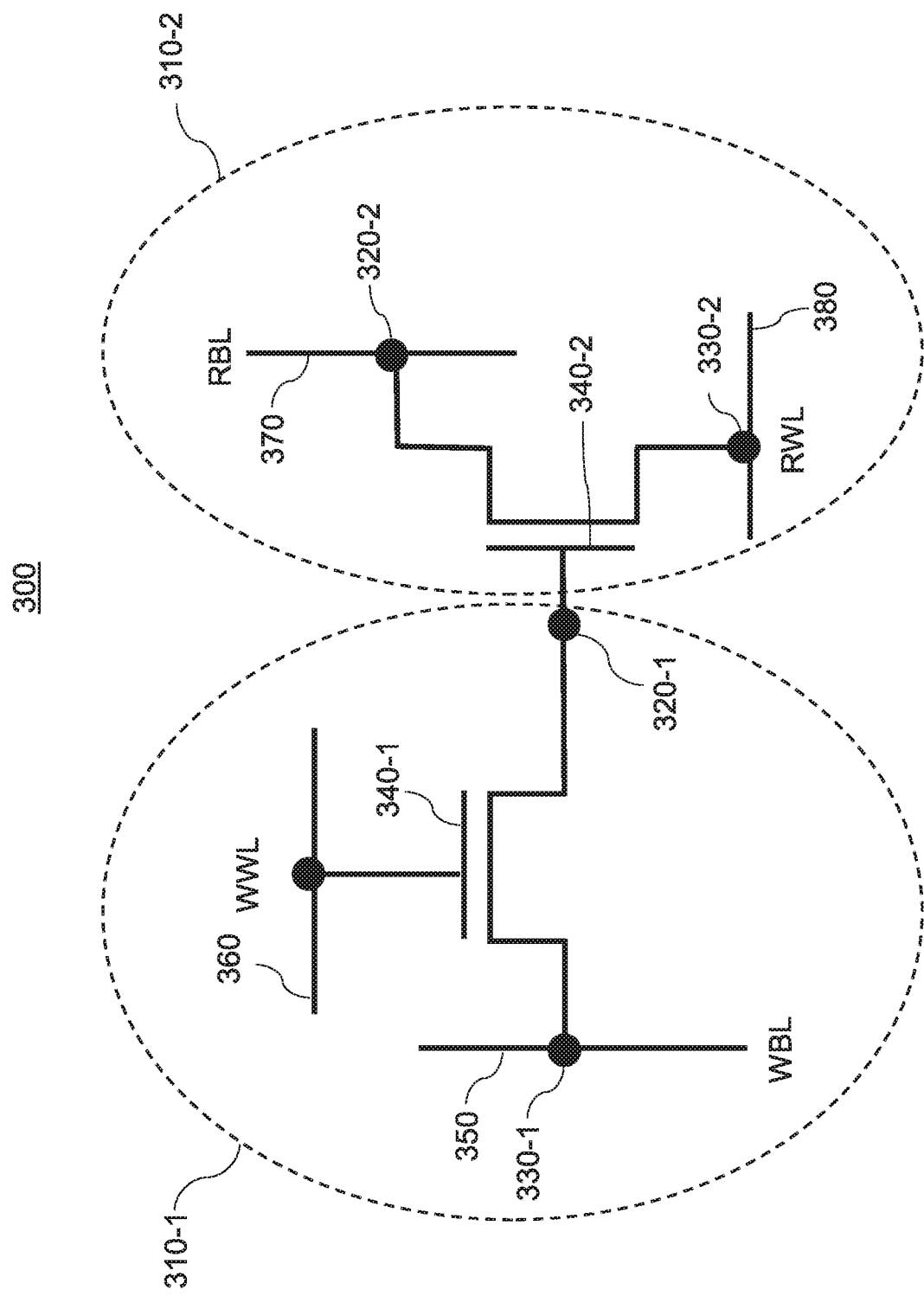
FIG. 3 is a schematic diagram of a gain memory cell, in accordance with an embodiment of the present invention.

With reference to FIG. 3, a schematic diagram is provided illustrating an example of a 2T memory cell 300. In one embodiment, the memory cell 300 is a gain memory cell. For example, the memory cell 300 can correspond to, e.g., memory cell 212-(1,1) of FIG. 1.

As shown, the memory cell 300 can include a first transistor device 310-1 and a second transistor device 310-2. Since the first transistor device 310-1 is on the left and the second transistor device 310-2 is on the right in this illustrative embodiment, the first transistor device 310-1 can be referred to as a "left" transistor device and the second transistor device 310-2 can be referred to as a "right" transistor device in this example.

The first and second transistor devices 310-1 and 310-2 can include FETs. For example, the first transistor device 310-1 can include a source/drain 320-1, a drain/source 330-1 and a gate 340-1, and the second transistor device 310-2 can include a source/drain 320-2, a drain/source 330-2 and a gate 340-2. As shown in FIG. 3, the source/drain 320-1 can be coupled to the gate 340-2. The gate capacitor of the second transistor device 310-2 can function as a storage capacitor.

In this illustrative embodiment, the first and second transistor devices 310-1 and 310-2 can include n-type FETs (NFETs). However, such an embodiment should not be considered limiting. For example, in another embodiment, the first and second transistor devices 310-1 and 310-2 can include p-type FETs (PFETs). In yet another embodiment, one of the first and second transistor devices 310-1 and 310-2 can include an NFET and the other of the first and second transistor devices 310-1 and 310-2 can include a PFET.

The first transistor device 310-1 can include a WBL 350 coupled to the drain/source 330-1 and a WWL 360 coupled to the gate 340-1. The second transistor device 310-2 can include an RBL 370 coupled to the source/drain 320-2, and a RWL 380 coupled to the drain/source 330-2. Thus, in this illustrative embodiment, the memory cell 300 includes a "right" RBL, in that the RBL 370 corresponds to the "right" transistor device 310-2 of the memory cell 300.

To write logic "1", the WWL 360 can be turned on, and a supply voltage (e.g., Vdd) can be applied to the WBL 350 to charge the gate capacitor of the second transistor device 310-2. To write logic "0", the WWL 360 can be turned on, and the WBL 350 is grounded (e.g., 0V) to discharge the gate capacitor of the second transistor.

In standby mode (e.g., hold mode), both RBL 370 and RWL 380 are at a same potential (e.g., Vdd).

To perform a read operation, the RWL 380 can be biased at 0V, and the RBL 370 can be precharged at Vdd. If the storage node is "1", then the second transistor device 310-2 is ON, and the RBL 370 is discharged. If the storage node is "0", the second transistor device 310-2 is OFF, and the RBL 370 voltage remains unchanged.

The operating/supply voltage (e.g., Vdd) is fully compatible with CMOS technology, and there is no need to boost the voltage of the WWL 360. Generally, when writing "0" with CMOS operating/supply voltages, the storage node voltage is at 0V. When writing "1" with CMOS operating/supply voltages, the storage node voltage cannot reach full Vdd when the WWL 360 and WBL 350 are both at Vdd. Instead, the maximum voltage of the storage node at "1" can be equal to [Vdd–$V_t$ (device 310-1)], where $V_t$ (device 310-1) is the threshold voltage corresponding to the first transistor device 310-1.

The lack of full Vdd at the storage node can be problematic for memory applications. However, the lack of full Vdd at the storage node can be beneficial for random number generation applications in accordance with the embodiments described herein. For example, the lower voltage at "1" can further reduce the retention time, and the threshold voltage variation of the first transistor device 310-1 can also enhance the inherent randomness of the random number generator.

Gain memory cells are an example of memory cells that can have a very short retention time (e.g., tuned to about 100 nanoseconds) due to (1) small capacitance of transistors and (2) leakage current of transistors (e.g., subthreshold leakage, gate induced drain leakage (GIDL) leakage, gate leakage, and junction leakage). The logic state of such a memory cell could flip (e.g., "1" can become "0" or "0" can become "1") once the memory cell passes its retention time. Due to the inherent process variability, the retention time of an array of these kinds of memory cells can vary, exhibiting a stochastic destruction. For an array of such memory cells starting with logic "1", after a nominal retention time to, those memory cells with a retention time less than to can flip $t_0$ "0" while those memory cells with a retention time greater than to can remain at "1". Memory cells of the array with a retention time around $t_0$ can flip randomly. These properties can be exploited to form a random number generator based on memory cells (e.g., gain memory cells).

Figure 4:
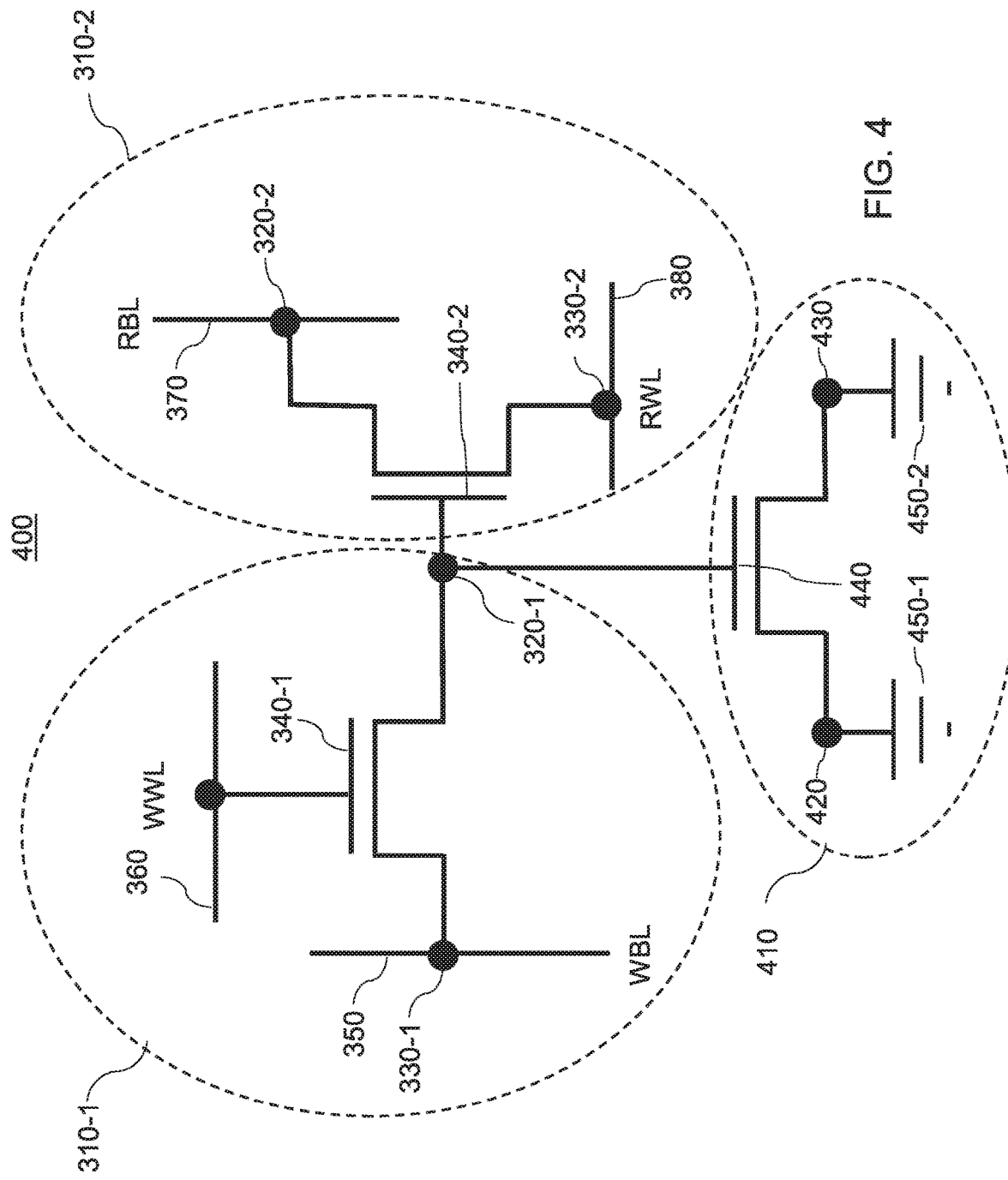
FIG. 4 is a schematic diagram of a gain memory cell, in accordance with another embodiment of the present invention.

With reference to FIG. 4, a schematic diagram is provided illustrating an example of a 3T memory cell 400. In one embodiment, the memory cell 400 is a gain memory cell. As shown, the memory cell 400 can include the first transistor device 310-1 and the second transistor device 310-2, as described above with reference to FIG. 3.

As further shown, the memory cell 400 further includes a third transistor device 410. The third transistor device 410 can include a FET. In one embodiment, the third transistor device 410 can include an NFET. In another embodiment, the third transistor device 410 can include a PFET.

For example, the third transistor device 410 can include a source/drain 420, a drain/source 430 and a gate 440. As shown in FIG. 4, the source/drain 420 can be coupled to ground 450-1 (e.g., 0V), the drain/source 430 can be coupled to ground 450-2 (e.g., 0V), and the gate 440 can be coupled to the gate 340-2 of the second transistor device 310-2. The third transistor 410 can function as a capacitor to tune the retention time of the memory cell 400.

As mentioned above, it is to be understood that the 2T and 3T memory cells of the array described in FIGS. 1-4 are purely exemplary, and it is to be appreciated that the memory cells of the array can be formed from any suitable number of transistors in accordance with the embodiments described herein.

Further details regarding the operation of a system implementing a random number generator will now be described in further detail below with reference to FIG. 5.

Figure 5:
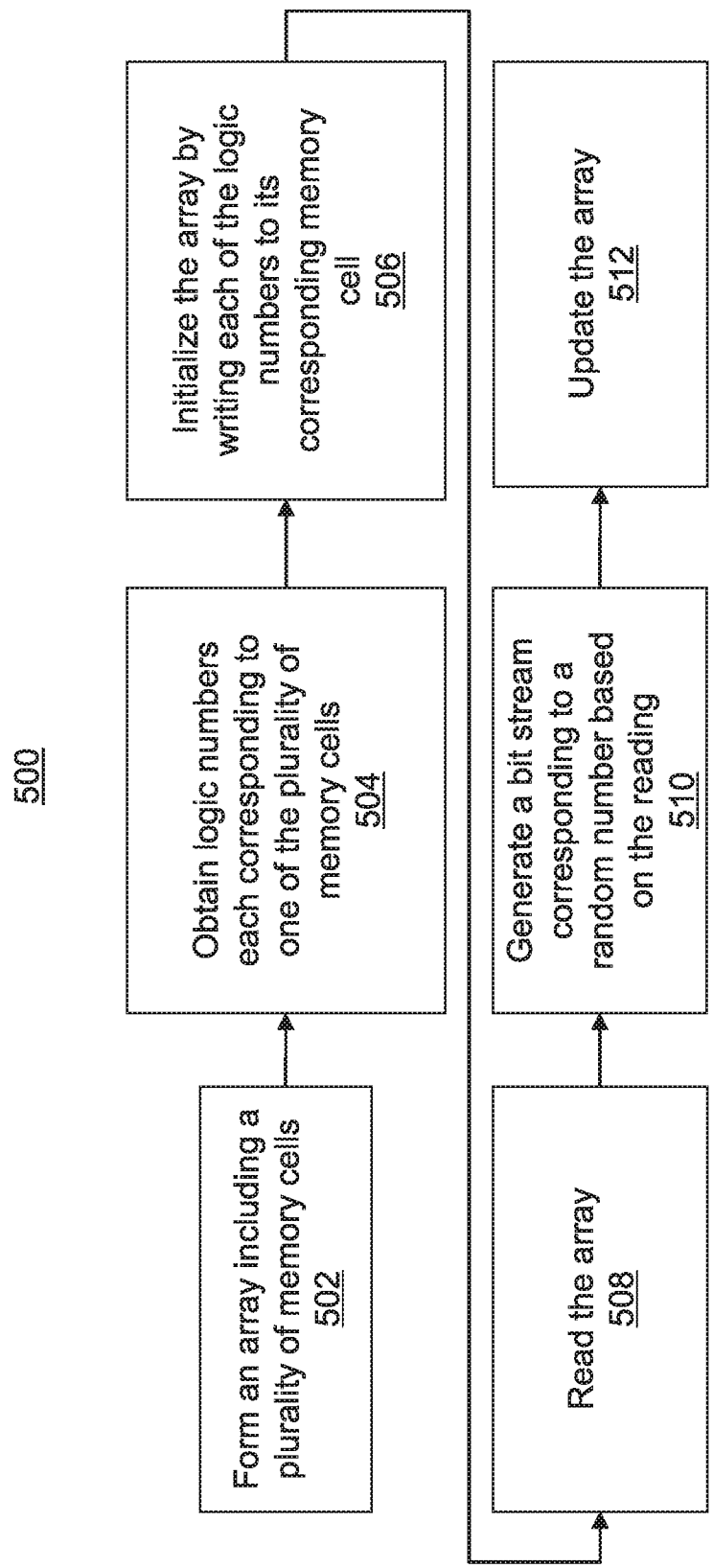
FIG. 5 is a block/flow diagram illustrating a system/method for implementing a semiconductor device including a random number generator, in accordance with an embodiment of the present invention.

With reference to FIG. 5, a block/flow diagram is shown illustrating a system/method 500 for fabricating a semiconductor device including stacked access device and resistive memory, in accordance with an embodiment.

At block 502, an array including a plurality of memory cells is formed. The array can be included as part of a memory device component of a system implementing a random number generator. In one embodiment, the plurality of memory cells include gain memory cells. Each of the plurality of memory cells can include a first transistor and a second transistor. In one embodiment, the first and second transistors include field-effect transistors (FETs). The drain/source of the first transistor can be connected to the gate of the second transistor, and the gate capacitor of the second transistor can function as a storage capacitor. That is, each memory cell can be formed as a 2T memory cell.

Forming the array can further include coupling each of the plurality of memory cells with respective lines. For example, the first transistor of a given one of the memory cells can include a write wordline (WWL) coupled to its gate and a write bitline (WBL) coupled to its source/drain, and the second transistor of the given memory cell can include a read wordline (RWL) coupled to its source/drain and a read bitline (RBL) coupled to its drain source. Forming the array can further include coupling each of the WWLs and RWLs to a read decoder, and coupling each of the WBLs and RBLs to a column decoder.

To write logic "1", the WWL can be turned on, and a supply voltage (e.g., Vdd) can be applied to the WBL to charge the gate capacitor of the second transistor. To write logic "0", the WWL can be turned on, and the WBL is grounded (e.g., 0V) to discharge the gate capacitor of the second transistor.

In standby mode (e.g., hold mode), both RWL and RBL are at a same potential (e.g., Vdd).

To perform a read operation, the RWL can be biased at 0V, and the RBL can be precharged at Vdd. If the storage node is "1", then the second transistor is ON, and the RBL is discharged. If the storage node is "0", the second transistor is OFF, and the RBL voltage remains unchanged.

Two adjacent RBLs can form a pair of RBLs, and each RBL pair can include a first (e.g., ("left") RBL and a second (e.g., "right") RBL. Forming the array can further include coupling each RBL pair to a corresponding comparator (e.g., a current/voltage comparator). In one embodiment, at least one of the comparators includes a sense amplifier. The comparators can be included in a comparator component of the system implementing a random number generator.

In one embodiment, the array is formed to include 1024 columns and 16 rows, thereby corresponding to 16,384 bits (e.g., about 16 Kb). In this embodiment, there can be 512 total RBL pairs and 512 comparators each corresponding to its associated RBL pair.

At block 504, logic numbers each corresponding to one of the plurality of memory cells are obtained. The logic numbers can be obtained for use as seeds to initialize the array. In one embodiment, obtaining the logic numbers includes randomly generating each of the logic numbers using a pseudo-random number generator. In another embodiment, each of the logic numbers is obtained as a same logic number. For example, each of the logic numbers can be obtained as, e.g., logic "1".

At block 506, the array is initialized. The array can be initialized by writing each of the logic numbers to its corresponding memory cell.

As mentioned above, gain memory cells are one example of memory cells that have a very short retention time (e.g., tuned to about 100 nanoseconds) due to (1) small capacitance of transistors and (2) leakage current of transistors (e.g., subthreshold leakage, GIDL leakage, gate leakage, and junction leakage). The logic state of such a memory cell could flip (e.g., "1" can become "0" or "0" can become "1") once the memory cell passes its retention time. Due to the inherent process variability, the retention time of an array of such memory cells can vary, exhibiting a stochastic destruction. For an array of such memory cells, starting with logic "1", after a nominal retention time $t_0$, those memory cells with a retention time less than $t_0$ can flip to "0" while those memory cells with a retention time greater than $t_0$ can remain at "1". Memory cells of the array with a retention time around $t_0$ can flip randomly.

To exploit these properties, at block 508, the array is read. The array can be read by comparing signals between pairs of RBLs using the corresponding comparator. In one embodiment, the array is read at a time period determined based on a nominal retention time of the plurality of memory cells. More specifically, the array can be read at a time period that is sufficiently close to the nominal retention time.

For example, in the case that the nominal retention time is 100 nanoseconds, the array can be read at a time period of, e.g., about 90 nanoseconds to about 110 nanoseconds. In the case that the nominal retention time is about 300 nanoseconds, the array can be read at a time period of, e.g., about 280 nanoseconds to about 320 nanoseconds.

For each RBL pair, the corresponding comparator can output a logic number based on the comparison. As previously mentioned, the output of each comparator can be random due at least in part to the inherent random variation of transistors.

For example, for each RBL pair, the comparator can output a logic "1" in response to a current of first RBL of the RBL pair exceeding a current of a second RBL of the RBL pair, and the comparator can output a logic "0" in response to the current of the first RBL being less than the current of the second RBL. In one embodiment, the first RBL can be the "left" RBL and the second RBL can be the "right" RBL. However, such an embodiment should not be considered limiting, and any suitable signal comparison operation can be performed in accordance with the embodiments described herein.

At block 510, a bit stream corresponding to a random number is generated based on the reading. More specifically, the bit stream can be generated by obtaining the outputs from each of the comparators, and assembling the outputs from each of the comparators. For example, the bit stream can include a bit stream of randomly generated outputs of logic "1"s and/or logic "0"s. The size of the bit stream depends on the number of comparators. For example, in the embodiment in which there are 512 comparators, the bit stream can correspond to a random 512 bit number.

At block 512, the array is updated based on the bit stream.

In one embodiment, the array can be updated based on the bit stream. More specifically, the bit stream can be used as feedback to update the array. For example, the randomness can be further improved by using a random number generated in accordance the embodiments described herein as the seed for a pseudo-random number generator (PRNG), such as, e.g., a hash function. For a hash function, each a change in a single bit in the seed can result in a dramatically different out random number. The random number can be fed back into to the array to update the logic state of the array.

In another embodiment, updating the array can include refreshing the array to logic "1" state, and then reading the array after a time period close to the nominal retention time.

Further details regarding the operation of FIG. 5 are described above with reference to FIGS. 1-4.

Having described preferred embodiments of a semiconductor device including a random number generator and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for implementing a semiconductor device including a random number generator, comprising:
    reading an array of a plurality of memory cells of a memory device component, including comparing signals between pairs of read bitlines (RBLs) connected to corresponding comparators of a comparator component;
    obtaining outputs from each of the comparators based on the comparison; and
    generating a bit stream corresponding to a random number based on the reading, including assembling the outputs from each of the comparators.

2. The method of claim 1, further comprising initializing the array.

3. The method of claim 2, further comprising obtaining logic numbers each corresponding to a respective one of the plurality of memory cells, wherein initializing the array further includes writing each of the logic numbers to its corresponding memory cell as a seed for the initialization.

4. The method of claim 3, wherein obtaining the logic numbers further includes randomly generating each of the logic numbers using a pseudo-random number generator.

5. The method of claim 3, wherein each of the logic numbers is obtained as logic "1".

6. The method of claim 1, wherein the array is read at a time period determined based on a nominal retention time of the plurality of memory cells.

7. The method of claim 1, wherein, for each RBL pair:
the comparator outputs a logic "1" in response to a current of a left RBL of the RBL pair exceeding a current of a right RBL of the RBL pair; and
the comparator outputs a logic "0" in response to the current of the left RBL being less than the current of the right RBL.

8. The method of claim 1, wherein each of the plurality of memory cells is a two transistor (2T) gain memory cell including a first transistor and a second transistor, wherein the first transistor includes a write wordline (WWL) and a write bitline (WBL), and the second transistor includes a read wordline (RWL) and the RBL.

9. The method of claim 1, further comprising forming the array to include 1024 columns and 16 rows, and 512 pairs of RBLs corresponding to 512 comparators.

10. The method of claim 1, further comprising updating the array.

11. A method for implementing a semiconductor device including a random number generator, comprising:
initializing an array of a plurality of memory cells of a memory device component, each of the plurality of memory cells being a two transistor (2T) gain memory cell including a first transistor and a second transistor, wherein the first transistor includes a write wordline (WWL) and a write bitline (WBL), and the second transistor includes a read wordline (RWL) and the a read bitline (RBL);
reading the array at a time period determined based on a nominal retention time of the plurality of gain cells, including comparing signals between pairs of RBLs connected to corresponding comparators of a comparator component;
obtaining outputs from each of the comparators based on the comparison, wherein, for each RBL pair:
the comparator outputs a logic "1" in response to a current of a left RBL of the RBL pair exceeding a current of a right RBL of the RBL pair; and
the comparator outputs a logic "0" in response to the current of the left RBL being less than the current of the right RBL; and
generating a bit stream corresponding to a random number, including assembling the outputs from each of the comparators.

12. The method of claim 11, further comprising obtaining logic numbers each corresponding to a respective one of the plurality of memory cells, wherein initializing the array further includes writing each of the logic numbers to its corresponding memory cell as a seed for the initialization.

13. The method of claim 12, wherein obtaining the logic numbers further includes randomly generating each of the logic numbers using a pseudo-random number generator.

14. The method of claim 12, wherein each of the logic numbers is obtained as logic "1".

15. The method of claim 11, further comprising forming the array to include 1024 columns and 16 rows, and 512 pairs of RBLs corresponding to 512 comparators.

16. The method of claim 11, further comprising updating the array.

17. A semiconductor device including a random number generator, comprising:
a memory device component including an array of a plurality of memory cells; and
a comparator component including a plurality of comparators connected to respective pairs of read bitlines (RBLs), each of the plurality of comparators being configured to:
read the array by comparing a current difference of its corresponding pair of RBLs; and
generate an output based on a comparison, wherein the outputs are assembled to generate a bit stream corresponding to a random number.

18. The device of claim 17, wherein each of the plurality of memory cells is a two transistor (2T) gain memory cell including a first transistor and a second transistor, wherein the first transistor includes a write wordline (WWL) and a write bitline (WBL), and the second transistor includes a read wordline (RWL) and the RBL.

19. The device of claim 17, wherein, for each RBL pair:
the comparator outputs a logic "1" in response to a current of a left RBL of the RBL pair exceeding a current of a right RBL of the RBL pair; and
the comparator outputs a logic "0" in response to the current of the left RBL being less than the current of the right RBL.

20. The device of claim 17, wherein the array includes 1024 columns and 16 rows, and 512 pairs of RBLs corresponding to 512 comparators.

* * * * *